(12) United States Patent
Yao et al.

(10) Patent No.: US 12,033,904 B2
(45) Date of Patent: Jul. 9, 2024

(54) SEMICONDUCTOR PACKAGE SYSTEM AND RELATED METHODS

(71) Applicant: SEMICONDUCTOR COMPONENTS INDUSTRIES, LLC, Phoenix, AZ (US)

(72) Inventors: Yushuang Yao, Seremban (MY); Chee Hiong Chew, Seremban (MY); Atapol Prajuckamol, Klaeng (TH)

(73) Assignee: SEMICONDUCTOR COMPONENTS INDUSTRIES, LLC

( * ) Notice: Subject to any disclaimer, the term of this patent is extended or adjusted under 35 U.S.C. 154(b) by 510 days.

(21) Appl. No.: 17/086,932

(22) Filed: Nov. 2, 2020

(65) Prior Publication Data

US 2021/0050272 A1 Feb. 18, 2021

Related U.S. Application Data

(63) Continuation of application No. 15/341,367, filed on Nov. 2, 2016, now Pat. No. 10,825,748, which is a
(Continued)

(51) Int. Cl.
*H01L 23/48* (2006.01)
*H01L 23/053* (2006.01)
(Continued)

(52) U.S. Cl.
CPC ............ *H01L 23/053* (2013.01); *H01L 23/08* (2013.01); *H01L 23/18* (2013.01);
(Continued)

(58) Field of Classification Search
CPC ....... H01L 24/85; H01L 24/49; H01L 23/053; H01L 23/18; H01L 23/49811; H01L 23/08; H01L 23/06
See application file for complete search history.

(56) References Cited

U.S. PATENT DOCUMENTS 5,291,178 A 3/1994 Strief et al.
5,747,875 A 5/1998 Oshima
(Continued)

FOREIGN PATENT DOCUMENTS

DE 69126714 T2 1/1991
DE 19758864 B4 12/1997
(Continued)

OTHER PUBLICATIONS

English Abstract, Corresponds to JPH04162554A, Retrieved from Internet [https:worldwide.espacenet.com], Aug. 24, 2017, 2 pages.

*Primary Examiner* — Hoa B Trinh
(74) *Attorney, Agent, or Firm* — Adam R. Stephenson, LTD.

(57) ABSTRACT

Implementations of a semiconductor package may include: a substrate, a case coupled to the substrate, and a plurality of press-fit pins. The plurality of press-fit pins may be fixedly coupled with the case. The plurality of press-fit pins may have at least one locking portion that extends from a side of the plurality of press-fit pins into the case and the plurality of press-fit pins may be electrically and mechanically coupled to the substrate.

19 Claims, 8 Drawing Sheets

Related U.S. Application Data continuation-in-part of application No. 15/136,605, filed on Apr. 22, 2016, now Pat. No. 11,342,237.

(60) Provisional application No. 62/267,349, filed on Dec. 15, 2015.

(51) Int. Cl.
 *H01L 23/08* (2006.01)
 *H01L 23/18* (2006.01)
 *H01L 23/498* (2006.01)

(52) U.S. Cl.
 CPC ............... *H01L 23/49811* (2013.01); *H01L 2224/48091* (2013.01); *H01L 2224/48227* (2013.01)

(56) References Cited

U.S. PATENT DOCUMENTS

| | | | |
|---|---|---|---|
| 5,967,858 A | 10/1999 | Yamada | |
| 6,719,573 B2 | 4/2004 | Koehler et al. | |
| 7,108,567 B1* | 9/2006 | Korsunsky | H01R 12/73 439/74 |
| 7,494,389 B1 | 2/2009 | Essert et al. | |
| 9,263,820 B2 | 2/2016 | Mattiuzzo | |
| 2006/0160383 A1* | 7/2006 | Yamada | G01R 1/06755 439/86 |
| 2012/0295490 A1* | 11/2012 | Schneider | H01R 12/91 29/423 |
| 2014/0151868 A1* | 6/2014 | Bayerer | H01L 23/24 257/690 |
| 2014/0199861 A1* | 7/2014 | Mattiuzzo | H01R 13/415 29/842 |
| 2016/0247735 A1* | 8/2016 | Lin | H01L 23/10 |

FOREIGN PATENT DOCUMENTS

| | | |
|---|---|---|
| DE | 102009000490 A1 | 1/2009 |
| EP | 0438165 B1 | 1/1991 |
| EP | 0513410 A1 | 5/1991 |
| JP | 04162554 A | 10/1990 |

\* cited by examiner

SEMICONDUCTOR PACKAGE SYSTEM AND RELATED METHODS

CROSS REFERENCE TO RELATED APPLICATIONS

This application is a continuation application of the earlier U.S. Utility patent application to Yao, et al. entitled "Semiconductor Package System and Related Methods," application Ser. No. 15/341,367, filed Nov. 2, 2016, now pending, which application is a continuation-in-part application of the earlier U.S. Utility patent application to Yao, et al. entitled "Semiconductor Package System and Related Methods," application Ser. No. 15/136,605, filed Apr. 22, 2016, now pending which claimed the benefit of the filing date of U.S. Provisional patent application to Yao, et al., entitled "Semiconductor Package System and Related Methods, application Ser. No. 62/267,349, filed Dec. 15, 2015, the disclosures of each of which are hereby incorporated entirely herein by reference.

BACKGROUND

1. Technical Field

Aspects of this document relate generally to semiconductors, such as power integrated modules. More specific implementations involve press-fit pins for connecting printed circuit board.

2. Background

Conventionally, to connect a substrate to another circuit board, press-fit pins have been used. Conventional method of manufacture involves using a fixture is used to hold the pins in place on the substrate during the soldering process. Following soldering, the case is conventionally attached separately from the pins.

SUMMARY

Implementations of a semiconductor package may include: a substrate, a case coupled to the substrate, and a plurality of press-fit pins. The plurality of press-fit pins may be fixedly coupled with the case. The plurality of press-fit pins may have at least one locking portion that extends from a side of the plurality of press-fit pins into the case and the plurality of press-fit pins may be electrically and mechanically coupled to the substrate.

Implementations of a semiconductor package may include one, all, or any of the following:

The plurality of press-fit pins may be molded into the case.

The package may include a potting compound.

The potting compound may include a silicone.

The package may include the cover with the plurality of press-fit pins molded into and fixedly coupled thereto. The cover may also include a potting opening.

The case may be configured to be fixedly coupled over one or more edges of the cover and over at least a portion of the substrate.

The case may have a plurality of locking projections that engage with the one or more edges of the cover and irreversibly lock the cover to the casing.

Implementations of a semiconductor package may include: a substrate, a case coupled to the substrate, and an opening including two or more struts that extend from a first surface of the opening to a second surface of the opening. A first set of a plurality of fingers may extend from a first strut of the two or more struts toward a third surface of the opening. A second set of a plurality of fingers may extend from a second strut of the two or more struts toward a fourth surface of the opening. A third set of a plurality of fingers may extend between the first strut and second strut of the two or more struts. The semiconductor package may also include a plurality of press-fit pins. The plurality of press-fit pins may be fixedly coupled with the case. The plurality of press-fit pins may be electrically and mechanically coupled to the substrate.

Implementations of a semiconductor package may include one, all, or any of the following:

The package may have a cover coupled to the case. The cover may have a plurality of openings. The plurality of openings may be configured to receive the plurality of press-fit pins.

The plurality of press-fit pins may be molded into the case.

The package may include a potting compound.

The potting compound may include a silicone.

Implementations of a semiconductor package may include: a substrate, a case having a perimeter coupled to the substrate, a cover having a plurality of openings therethrough coupled to the case, and a plurality of press-fit pins. The perimeter of the case may have one of a triangular, rectangular, hexagonal, and octagonal shape. The cover may have one of a triangular, rectangular, hexagonal, and octagonal shape. The plurality of press-fit pins may be fixedly coupled with the case and inserted into the plurality of openings of the cover. The plurality of press-fit pins may be electrically and mechanically coupled to the substrate.

Implementations of a semiconductor package may include one, all, or any of the following:

The cover may include a potting opening.

The plurality of press-fit pins may be molded into and fixedly coupled with the cover.

The case may be configured to be fixedly coupled over one or more edges of the cover and over at least a portion of the substrate.

The case may have a plurality of locking projections that engage at least two edges of the cover and irreversibly lock the cover to the case.

The plurality of press-fit pins may be molded into the case.

The package may include a potting compound.

The potting compound may include a silicone.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
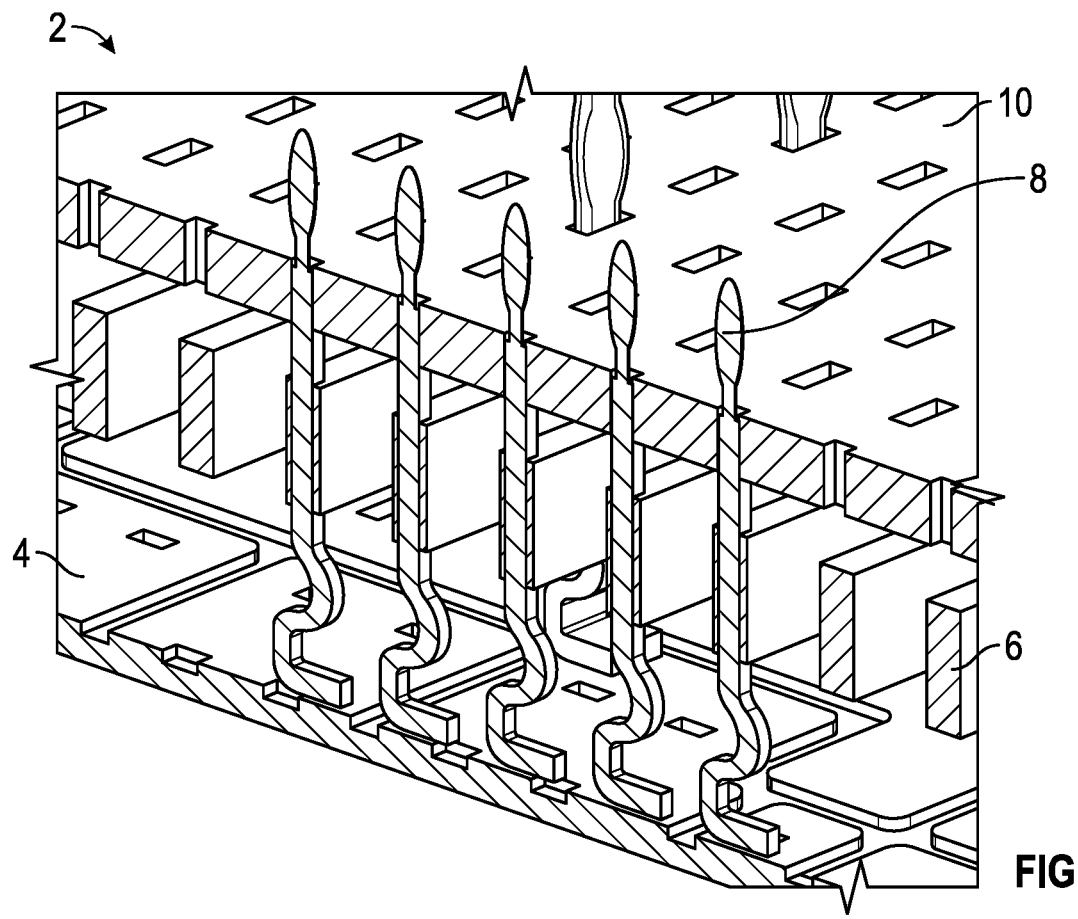
FIG. 1 is a perspective view of a plurality of press-fit pins molded into a case.

FIG. 1 illustrates a cross section view of a first implementation semiconductor package 2 where routing lines 4 are electrically and mechanically coupled to a plurality of press-fit pins 8. As illustrated, the plurality of press-fit pins is molded into a case having fingers 6. A cover 10 encloses the package 2 and the plurality of pins fit through a plurality of openings in the cover.

Figure 2:
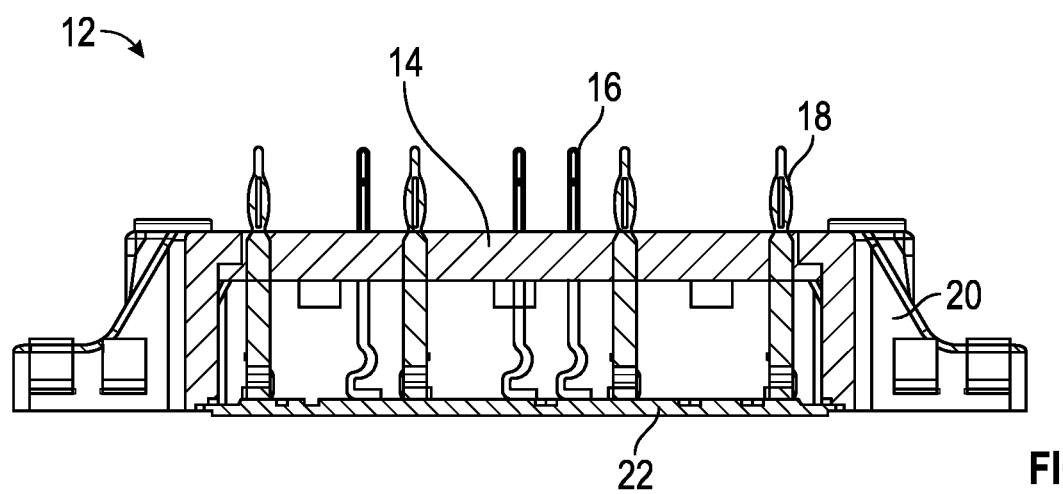
FIG. 2 is a side view of a plurality of press-fit pins molded into a cover.

Referring to FIG. 2, a second implementation of a semiconductor package 12 is illustrated. Differently oriented press-fit pins 16 and 18 are molded into and fixedly coupled to a cover 14 and enclosed in a case 20. The case 20 with a plurality of press-fit pins 16 and 18 and cover 14 is fixedly coupled to the substrate 22. Both first and second implementations of semiconductor packages disclosed herein may help to decrease stress on individual press-fit pins of the plurality of press-fit pins.

Figure 3A:
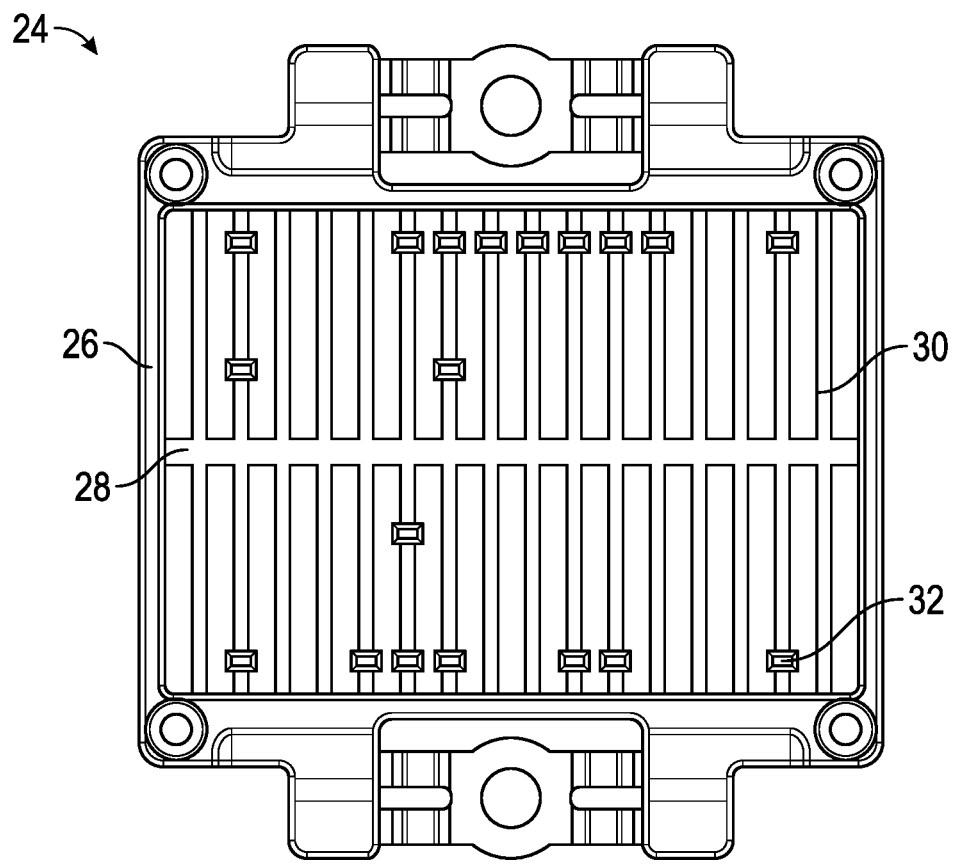
FIG. 3A is a top view of a plurality of press-fit pins molded into the fingers of a case.
Figure 3B:
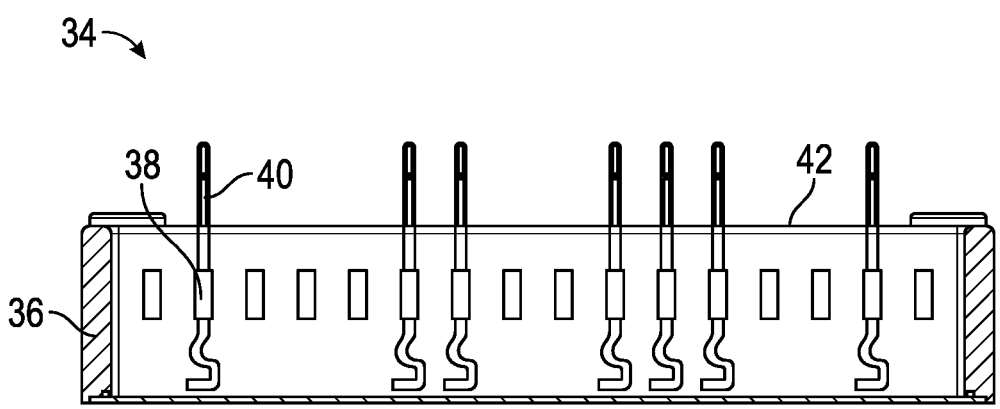
FIG. 3B is a cross-sectional view of a plurality of press-fit pins molded into the fingers of a case.

Referring to FIG. 3A, a top view of the first implementation of a semiconductor package 24 is illustrated. The case 26 has an opening therein where a strut 28 extends from a side of the opening to another side of the opening. A first set of a plurality of fingers 30 extend from the strut 28 on one side of the strut 28 and a second set of a plurality of fingers 30 extend from an opposing side of the strut 28. The plurality of press-fit pins 32 are molded into the fingers 30 and held by the fingers 30. Referring to FIG. 3B, a cross-sectional view of an implementation of a semiconductor package 34 like that of FIG. 3A is illustrated. The case 36 encloses the fingers 38 which are molded around the plurality of press-fit pins 40. By non-limiting example a cover 42 may be subsequently added over the press-fit pins 40 embedded in the fingers 38. As can be seen in FIG. 3B, all of the press fit pins are oriented the same directly to allow them to be molded in to the fingers 30. In such implementations, this may allow all of the fingers to have the same size. In other implementations, however, the fingers may vary in width and size relative to each other to allow pins of differing orientations (and/or sizes) to be simultaneously molded into the fingers.

Figure 4A:
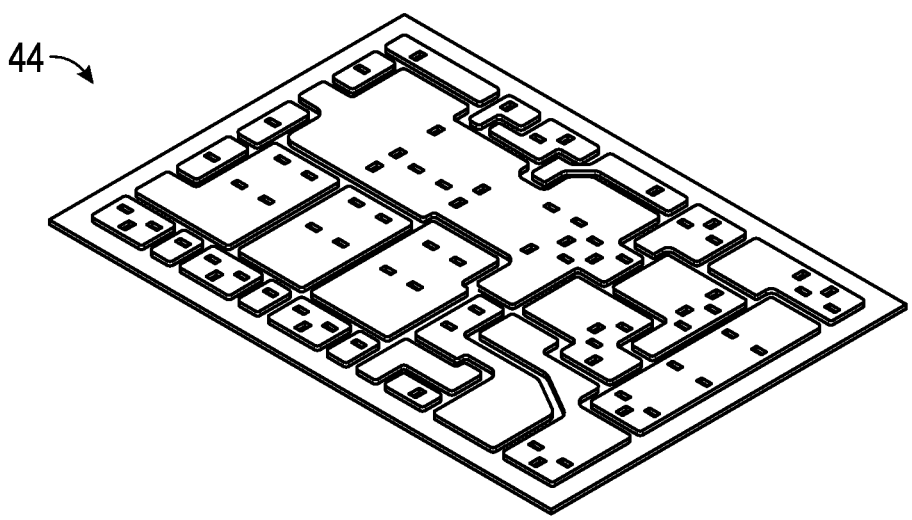
FIGS. 4A-4F shows an implementation of a method of making a semiconductor package with press-fit pins molded into fingers of a case.
Figure 4B:
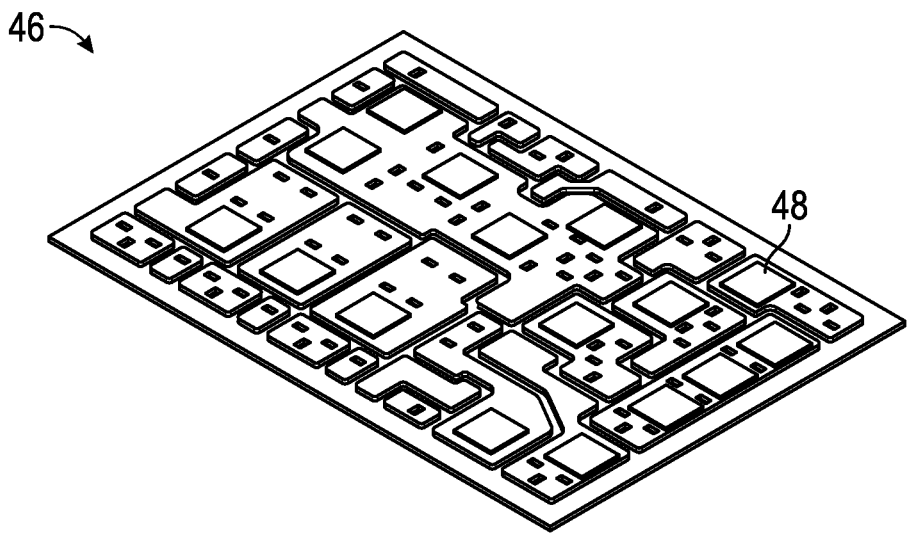
Figure 4C:
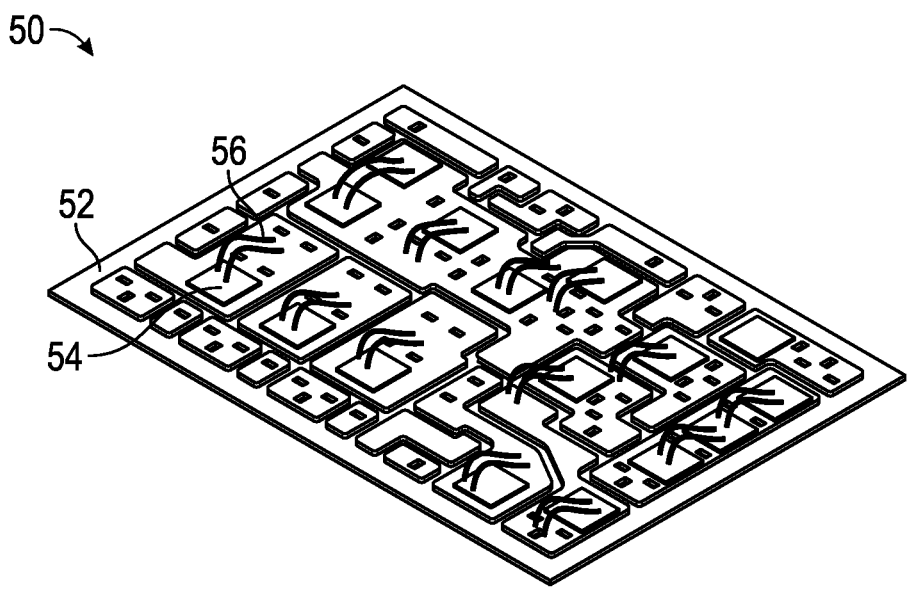
Figure 4D:
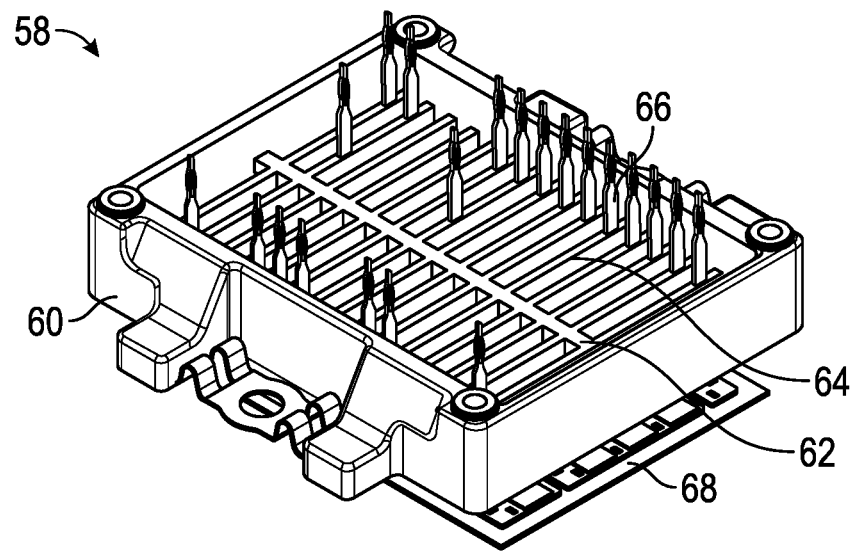
Figure 4E:
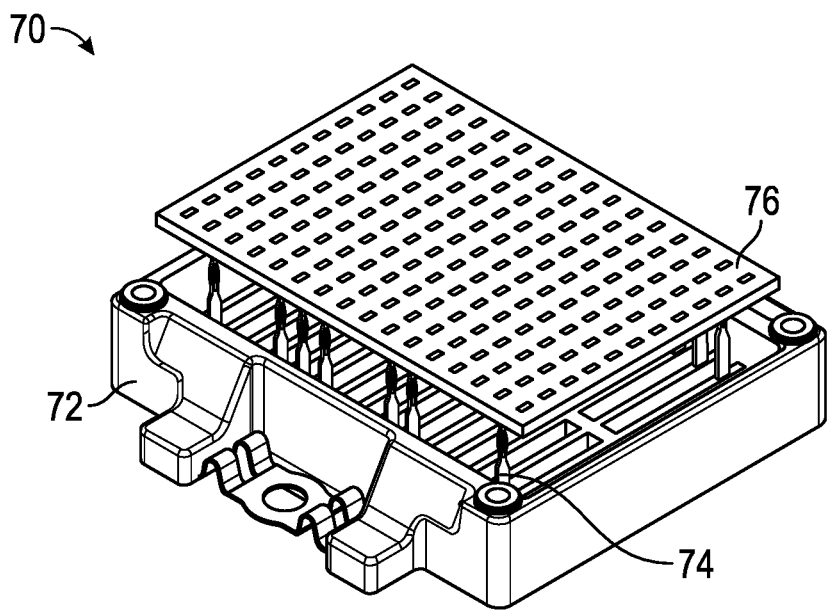
Figure 4F:
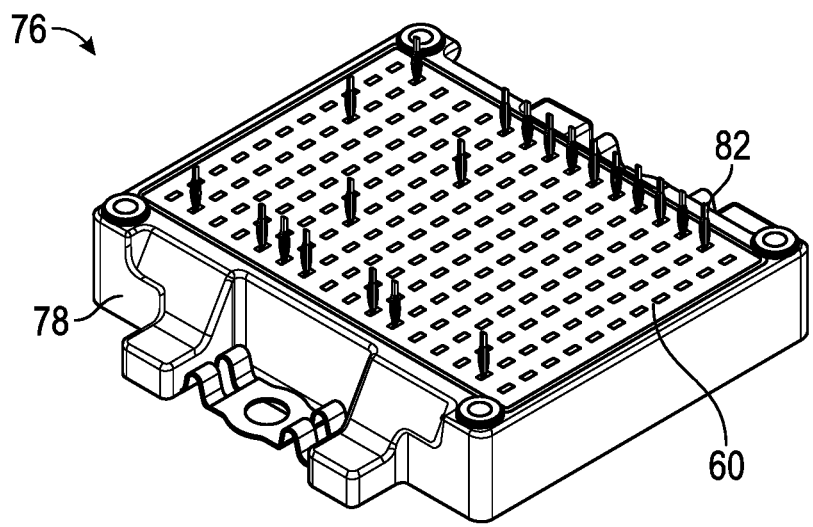

Referring to FIGS. 4A-4F, a method for manufacturing a semiconductor package is illustrated. FIG. 4A illustrates a substrate 44. The substrate 44 may be made of any material including copper, silicon, any combination thereof, or a ceramic or other electrically conductive/insulative material. FIG. 4B illustrates the addition of die 48 to the substrate 46. The die 48 can include, by non-limiting example, an insulated gate bipolar junction transistor (IGBT) a rectifier, a metal oxide field effect transistor (MOSFET), or any other semiconductor device. FIG. 4C illustrates the semiconductor package 50 with addition of connectors 56 to mechanically and electronically connect the die 54 to other die 48 and to the substrate 52. The connectors 56 may include a wire made of any electrically conductive material. FIG. 4D illustrates the semiconductor package 58 as case 60 that includes the plurality of pins molded into it is being coupled to the substrate 68. The case 60 is similar to that illustrated in FIGS. 3A and 3B. The case 60 has a strut 62 that extends from one side of an opening in the case to an opposite side of the opening. Extending from either side of the strut 62 are fingers 64. The fingers 64 extend from the strut 62 to the sides of the case 60. Embedded in the fingers 64 of the strut is a plurality of press-fit pins 66. The press-fit pins 66 are simultaneously electrically and mechanically coupled to the substrate 68 as the case 60 is coupled to the substrate 68 which may decrease the force exerted on the individual press-fit pins. FIG. 4E illustrates an optional step of coupling a cover 76 to the case 60. The cover 76 has holes therethrough formed in it that allow the press-fit pins 74 to pass through the cover 76. The cover 76 is placed over the press-fit pins and rests inside the case 72. In particular implementations, the cover rests on a flange formed around the opening in the cover. Before the cover 76 is added. a potting compound may be added through the opening within the case 72. FIG. 4F is an illustration of the finished semiconductor package 76. This method may allow for automation of semiconductor package manufacturing when using press-fit pins, as all of the pins may be simultaneously and mechanically coupled to the substrate when the case 60 is coupled to the substrate 68. This may eliminate the need to use fixtures of any kind to hold the pins individually or collectively to the substrate during manufacturing.

Figure 5A:
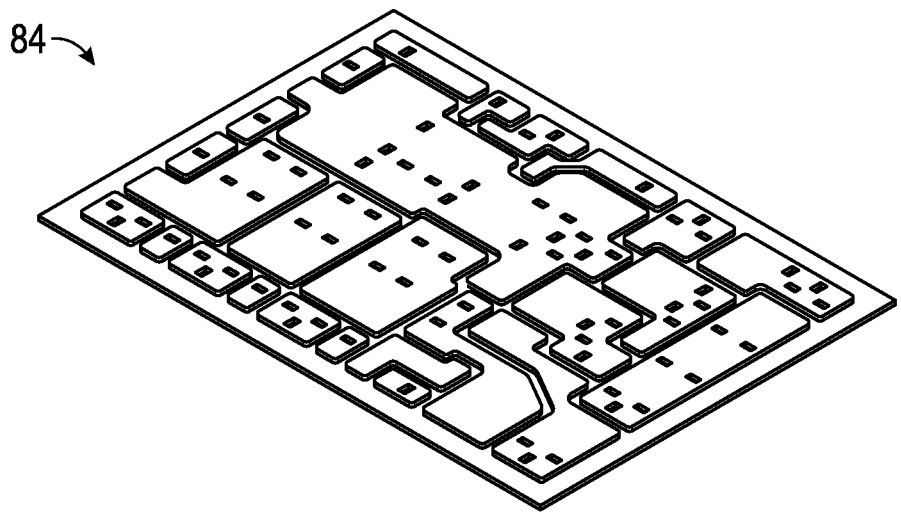
FIGS. 5A-5F shows an implementation of a method of making a semiconductor package with press-fit pins molded into a cover.
Figure 5B:
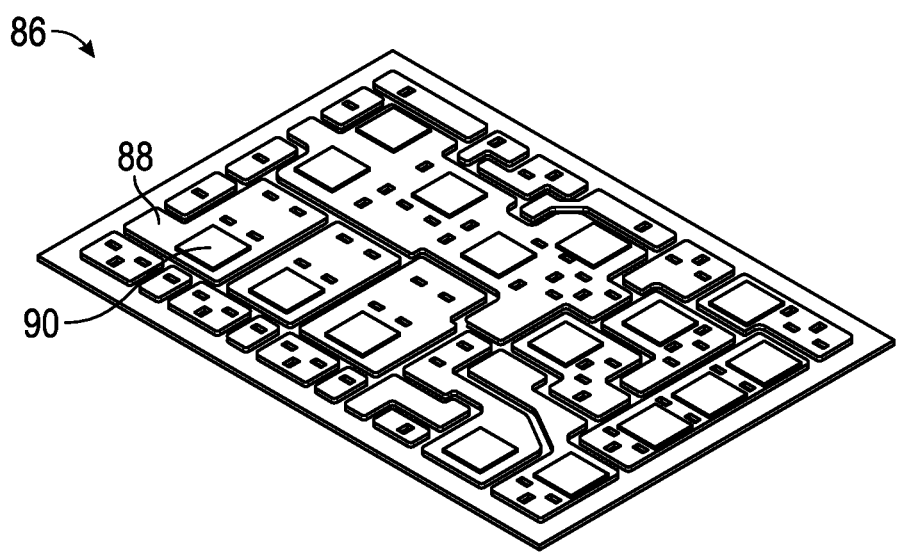
Figure 5C:
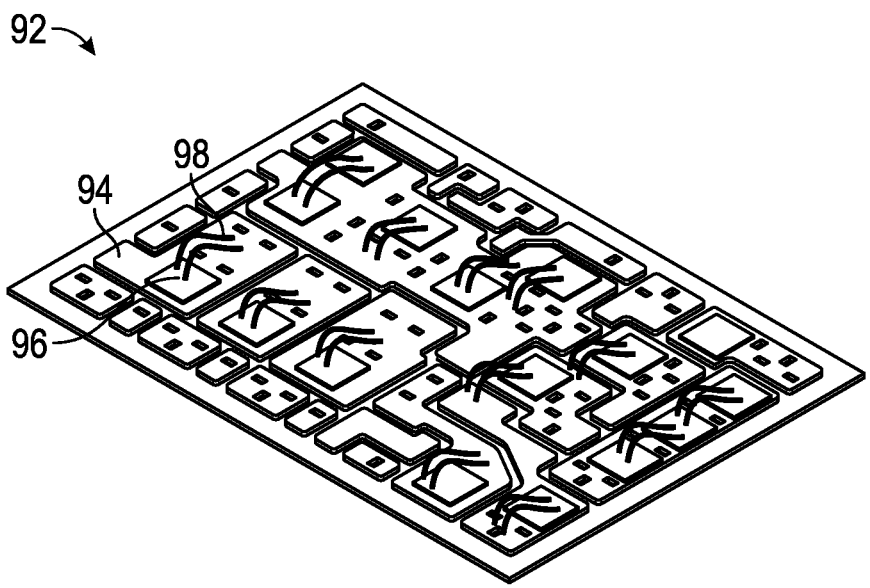
Figure 5D:
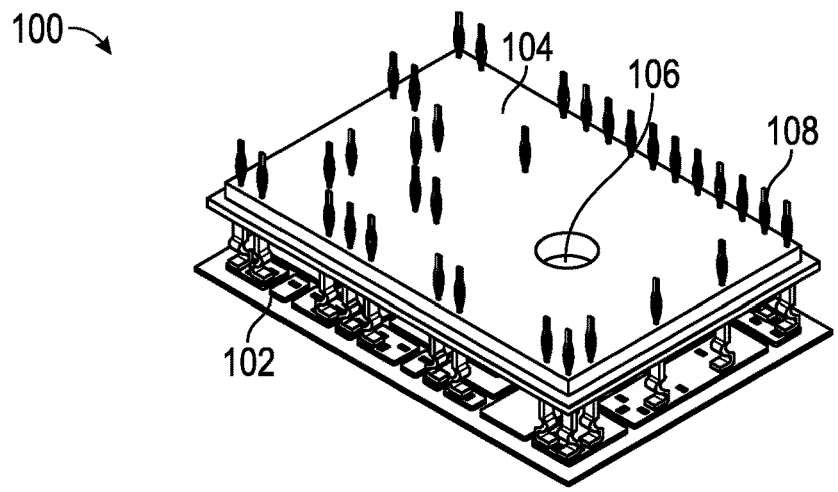
Figure 5E:
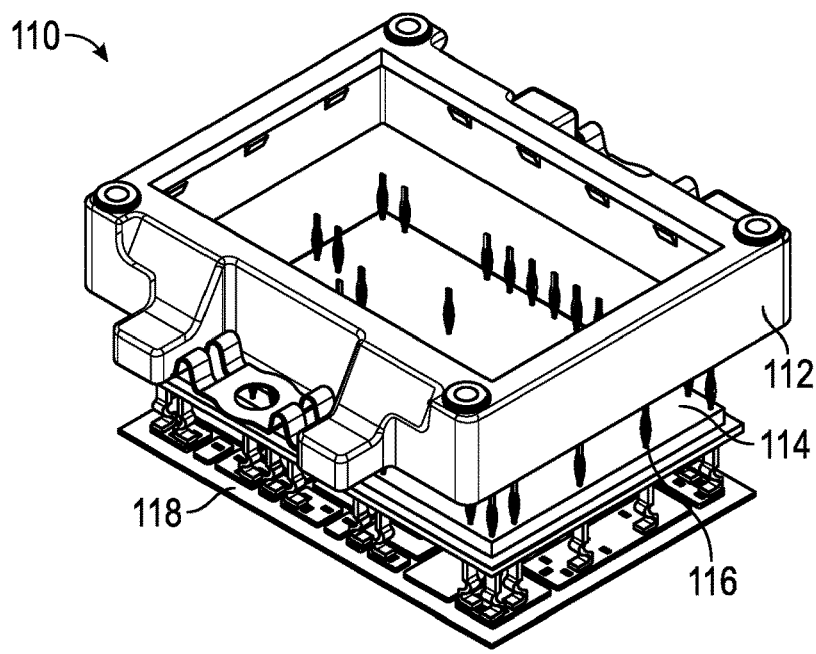
Figure 5F:
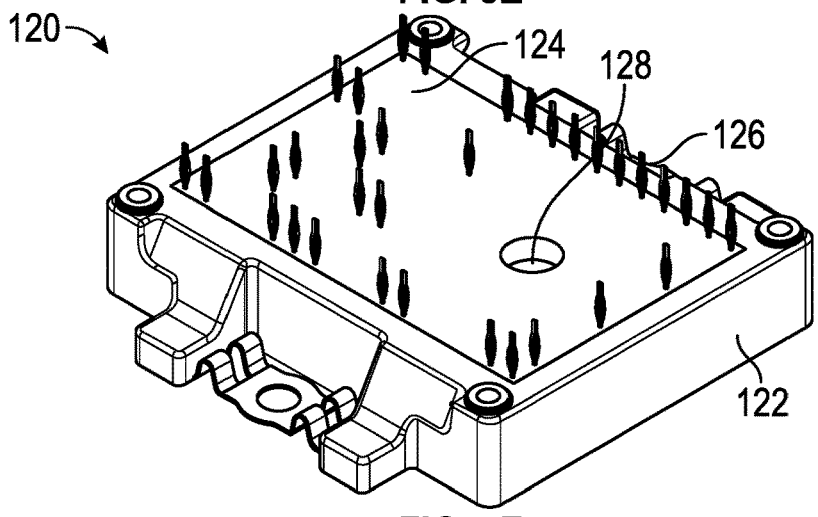

Referring to FIGS. 5A-5F, another implementation of a method of manufacturing a semiconductor package is illustrated. FIG. 5A illustrates a substrate 84. The substrate 84 may be made of any material including copper, silicon, ceramics, electrically conductive/insulative materials and any combination thereof. FIG. 5B illustrates the substrate following coupling of the die 90 to the substrate 88. The die 90 can include, by non-limiting example, an insulated gate bipolar junction transistor (IGBT) a rectifier, a metal oxide field effect transistor (MOSFET), or any other semiconductor device. FIG. 5C illustrates the semiconductor package 92 following coupling wires 98 to mechanically and electronically connect the die 96 to other die and to the substrate 94. FIG. 5D illustrates the semiconductor package following coupling of a cover 104 and press-fit pins 108 to the substrate 102. As can be seen from the figure, the press-fits pins 108 are molded into and fixedly coupled with the cover. When the cover is placed over the substrate the press-fit pins are electrically and mechanically coupled with the substrate 102. Also, they are automatically aligned to the specific locations on the substrate 102 to which they are to be bonded. The cover 104 includes an opening 106 to allow for the addition of potting compound. FIG. 5E illustrates the package after the case 112 has been coupled over the cover 104. The case 112 fits around and over the cover 114 with the embedded press-fit pins 116 and couples the cover 114 with the substrate 118. As illustrated, a flange extends around the perimeter of the cover 114 which engages with a corresponding flange around the opening of the case 112. In other implementations, however, the flange may be not included and the cover 114 may merely be retained within the opening of the case 112. The case 112 may also include a plurality of locking projections 113 which engage with the one or more edges of the cover 114. The locking projections 113 may, in various implementations, irreversibly lock the cover 114 to the case 112. FIG. 5F illustrates an implementation of the finished semiconductor package 120. The case 122 is coupled to the cover 124 and the embedded press-fit pins 126 are coupled to the substrate 102. Potting compound can now optionally be added through the opening 128 in the cover 124. This method may also allow for automation of semiconductor package manufacturing when using press-fit pins by eliminating the need for a fixture to be used to hold all of the pins during the soldering step. Instead, this method implementation permits a single fixture to be used that holds the cover itself during the soldering/coupling step, which is much simpler mechanically.

Figure 6:
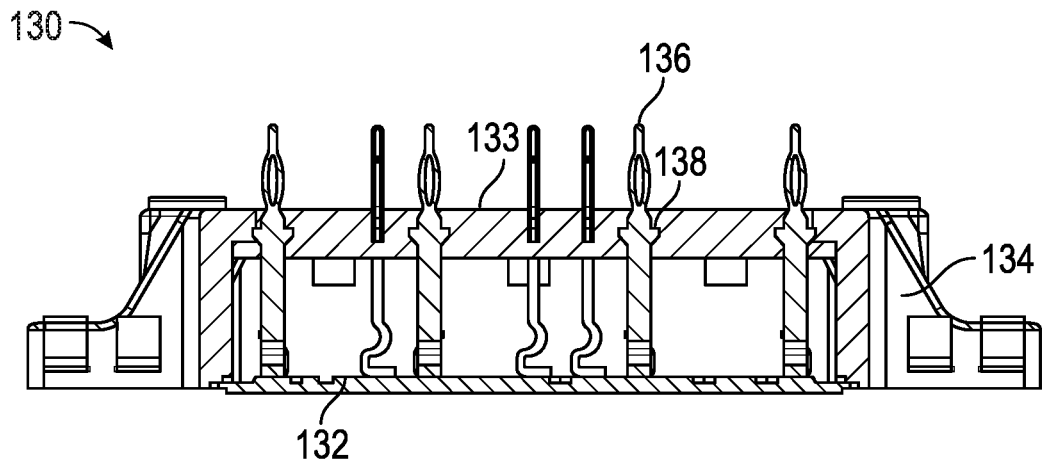
FIG. 6 is a side view of a plurality of press-fit pins having locking mechanisms fixedly coupled to a case.
Figure 7:
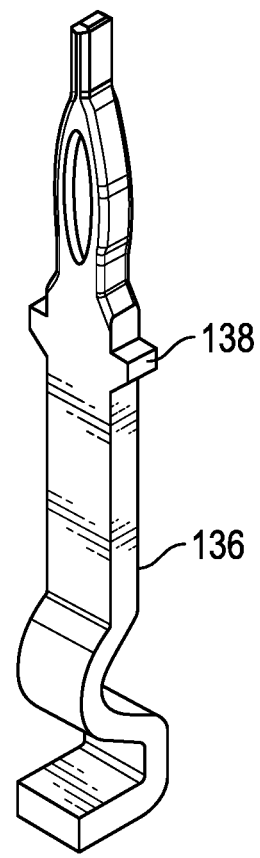
FIG. 7 is a view of a press-fit pin having a locking/mold locking mechanism/structure.

Referring now to FIG. 6, a side view of a plurality of press-fit pins having locking mechanisms/structures/projections fixedly coupled to a cover is illustrated. The semiconductor package 130 includes a substrate 132, a case 134 coupled to the substrate 132, a cover 133 coupled to the case 134, and a plurality of press-fit pins 136 fixedly coupled to the cover 133. In various implementations, the press-fit pins may be molded into the case or into the cover 133. In this implementation, each press-fit pin 136 has a locking portion 138 that extends from a side of the press-fit pin into the material of the case 134 or into the cover 133. The locking portions 138 serve a mold locking function to prevent the press-fit pins from sliding relative to the case or cover material during manufacturing or during insertion of the package into a motherboard or other connector. In other implementations, not all press-fit pins would include a locking portion; only particular ones would include this feature. The press-fit pins may include two or more locking portions extending from sides of the press-fit pins 136. In implementations with multiple locking portions, the locking portions may form a T or Y shape. The locking mechanisms may or may not be symmetrical in various implementations, and they may vary in shape, size, and location along the shaft of the pins. As illustrated, the plurality of press-fit pins 136 are electrically and mechanically coupled to the substrate 132 as the other pins disclosed in this document. FIG. 7 illustrates a close up view of a press-fit 136 pin with a locking portion 138.

In various implementations, any of the pin types disclosed in the following U.S. patent applications may also be used as press-fit pins in semiconductor package implementations disclosed herein: the application to Chew et al., entitled "Press-Fit Pin for Semiconductor Packages and Related Methods," application Ser. No. 14/662,591, filed Mar. 19, 2015; the application to Lin et al., entitled "Semiconductor Package with Elastic Coupler and Related Methods," application Ser. No. 14/626,758, filed Feb. 19, 2015, issued Aug. 30, 2016, as U.S. Pat. No. 9,431,311; the application to Yao et al., entitled "Flexible Press Fit Pins for Semiconductor Packages and Related Methods," application Ser. No. 14/703,002, filed May 4, 2015; the disclosures of each of which are hereby incorporated entirely herein by reference.

In various implementations, the semiconductor package 130 may include a potting compound. The potting compound may eliminate spacing such as gaps between the pins, housing, molding, and substrate, gaps within the cover, and any other spaces within the semiconductor package. The elimination of the spacing may serve to protect the components within the package from humidity, oxidation, and other damage. The potting compound may include a silicone, an epoxy, any combination thereof, or any other material designed to cover and protect the substrate and electrical components thereon.

In various implementations, the semiconductor package 130 may or may not include a cover 134. In the implementations with a cover, the cover may include any type of cover disclosed in this document or incorporated by reference herein. Further, the cover may be coupled to the case and press-fit pins in any manner disclosed in this document or incorporated by reference herein.

Figure 8:
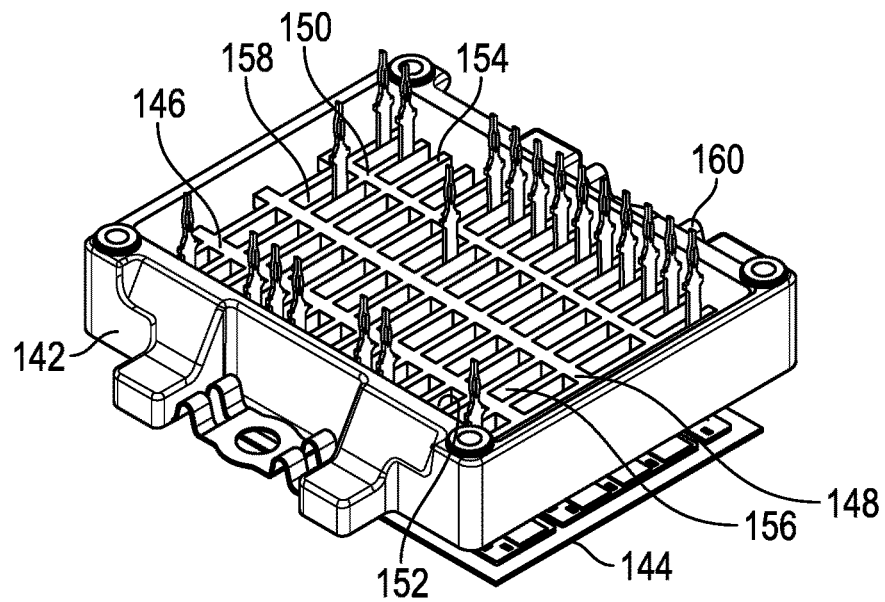
FIG. 8 is a view of a semiconductor package with multiple struts.

Referring now to FIG. 8, a view of a semiconductor package with multiple struts is illustrated. In this implementation, a semiconductor package includes a case 142 coupled to a substrate 144. The case has an opening with three struts 146 148 and 150 extending from a first surface of the opening to a second surface of the opening (the sides of the case to which the struts are coupled). In various implementations, the semiconductor package may include any number of two or greater struts. In particular implementations, the struts may be curved relative to any surface of the opening, in contrast with the struts illustrated in FIG. 8, which are straight relative to the parallel sides of the rectangular opening. In this implementation the opening is rectangular, however, in other implementations, and, as discussed later, the opening may be any closed shape.

The semiconductor package may include a first set of fingers 152 that extends from a first strut 146 to a surface of the opening. The first set of fingers 152 may or may not be coupled with the surface of the opening in various implementations. For those implementations where the first set of fingers are not coupled with the surface of the opening toward which they extend, they are supported by being coupled to the strut. In various implementations, the first set of fingers may be curved relative to the first strut. In other implementations, the first set of fingers may be curved relative to any strut.

The semiconductor package may include a second set of fingers 154 that extends from a second strut 150 to a fourth surface of the opening. The second set of fingers may or may not be coupled with the fourth surface of the opening, similar to the first set of fingers. The second set of fingers 154 may likewise be curved relative to the second strut 150 in various implementations. In other implementations, the second set of fingers 154 may be curved relative to any strut. The semiconductor package may include a third or more sets of fingers that extend between the first strut 146 and the second strut 150. As illustrated in FIG. 8, there is a third 156 and a fourth 158 set of fingers that extend between the first strut 146 and the second strut 150. The sets of fingers between the first strut 146 and the second strut 150 may be coupled to only a one or the other of the struts in various implementations. In other implementations, the sets of fingers extending between the first and second sets of fingers may be coupled to multiple struts. The third or more sets of fingers may also be curved relative to the to either the first strut 146 or the second strut 150. In other implementations, the third or more sets of fingers are curved relative to any strut between the first strut 146 and the second strut 150.

In various implementations, the semiconductor package may include a potting compound as previously discussed, which may be any disclosed in this document.

In various implementations, the semiconductor package may or may not include a cover. In the implementations with the cover, the cover may include any type of cover disclosed in this document or incorporated by reference herein. Further, the cover may be coupled to the case and press-fit pins in any manner disclosed in this document or incorporated by reference herein.

As previously discussed in this document, the semiconductor package also includes a plurality of press-fit pins 160. The press-fit pins 160 may be any disclosed in this document or incorporated by reference herein.

Figure 9:
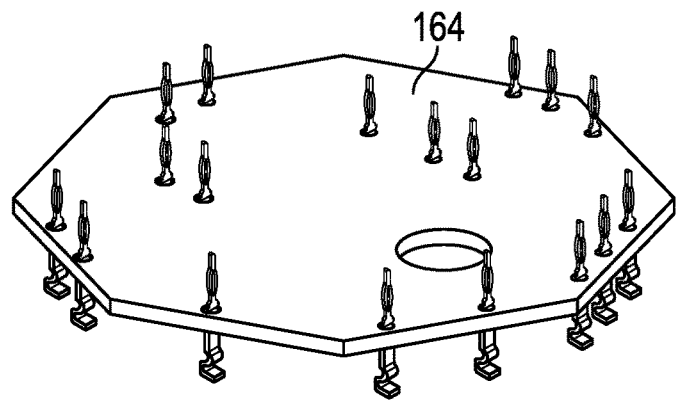
FIG. 9 is a view of an octagonally shaped cover.

In alternative implementations, the case for the semiconductor packages described in this document may include a perimeter which is circular, triangular, rectangular, hexagonal, octagonal, or any other closed shape. The semiconductor packages described may also include a cover which is correspondingly a circular, triangular, rectangular, hexagonal, octagonal, or any other closed shape. FIG. 9, is an illustration of an implementation of an octagonal cover 164. In some implementations the closed shape of the case's perimeter is the same shape as the cover, however, in other implementations the shape of the case's perimeter and the cover may not be the same, i.e., where multiple covers can be placed within a single cover such as, by non-limiting example, where two right triangular covers are placed within a square shaped cover.

Figure 10:
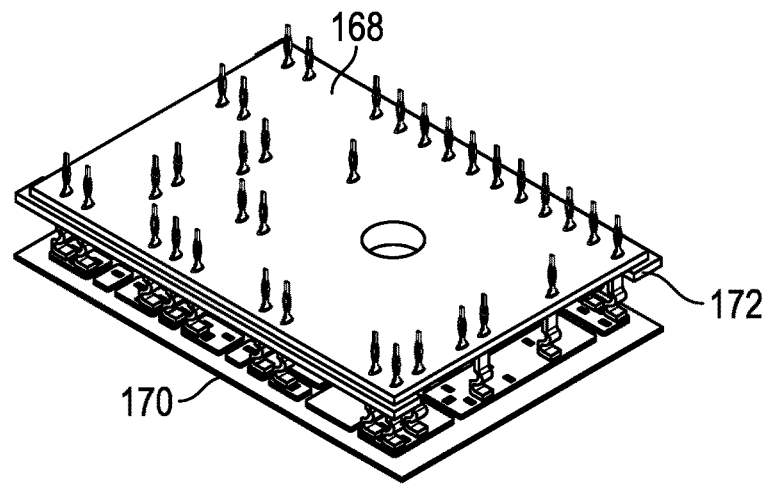
FIG. 10 is a view of cover for a semiconductor package having only two flanges.

Referring now to FIG. 10, a cover for a semiconductor package having only two flanges is illustrated. The case for the semiconductor package may be configured to be coupled over one or more edges of the cover 168 and at least part of the substrate 170. As previously discussed, the cover 168 may be any closed shape. The cover may contain a potting opening. The cover may contain a flange 172 on a side that is intended to be locked to the case. In particular implementations, the cover 168 may have a flange on two or more sides, which may or may not be adjacent sides. The case may have locking projections that engage the at least two flanged edges of the cover 168 and irreversibly lock the cover to the case. The locking projections may be any disclosed in this document. A wide variety of cover, case, and pin implementations and designs are possible using the principles disclosed herein.

In various implementations, the semiconductor package may include a potting compound like any of those disclosed herein.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
a substrate;
a case coupled to the substrate;
a cover coupled within an opening of the case; and
a plurality of press-fit pins;
wherein the plurality of press-fit pins is fixedly coupled with the case;
wherein the plurality of press-fit pins comprises at least one locking portion that extends from a side of the plurality of press-fit pins and is molded into only one of the case or the cover; and
wherein the plurality of press-fit pins is electrically and directly mechanically coupled to the substrate.

2. The package of claim 1, wherein the plurality of press-fit pins is molded into the case.

3. The package of claim 1, further comprising a potting opening.

4. The package of claim 1, wherein the plurality of press-fit pins are molded into and fixedly coupled to the cover, the cover comprising a potting opening therethrough.

5. The package of claim 1, wherein the case is configured to be fixedly coupled over one or more edges of the cover and over at least a portion of the substrate.

6. The package of claim 5, wherein the case comprises a plurality of locking projections that engage with the one or more edges of the cover and irreversibly lock the cover to the case.

7. A semiconductor package comprising:
a substrate;
a case comprising a perimeter coupled to the substrate, wherein the perimeter comprises one of a triangular, rectangular, hexagonal, or octagonal shape;
a cover directly coupled to the case, wherein the cover comprises a plurality of openings therethrough; and
a plurality of press-fit pins;
wherein the plurality of press-fit pins is molded into and fixedly and directly coupled with one of the case or the cover; and
wherein the plurality of press-fit pins is electrically and directly mechanically coupled to the substrate.

8. The package of claim 7, wherein the cover comprises a potting opening therethrough.

9. The package of claim 7, wherein the plurality of press-fit pins is molded into and fixedly coupled with the cover.

10. The package of claim 7, wherein the case is configured to be fixedly coupled over one or more edges of the cover and over at least a portion of the substrate.

11. The package of claim 7, wherein the case comprises a plurality of locking projections that engage at least two edges of the cover and irreversibly lock the cover to the case.

12. The package of claim 7, wherein the plurality of press-fit pins is molded into the case.

13. The package of claim 7, wherein each press-fit pin of the plurality of press-fit pins comprises a locking portion extending from a side of each press-fit pin and into one of the case and the cover.

14. The package of claim 7, wherein the cover comprises a plurality of openings and the plurality of press-fit pins are inserted into the plurality of openings.

15. A semiconductor package comprising:
a substrate;
a case coupled to the substrate; and
a plurality of press-fit pins;
wherein the plurality of press-fit pins comprises at least one locking portion that extends from a side of the plurality of press-fit pins and is molded into one of the case or a cover; and
wherein the plurality of press-fit pins is electrically and directly mechanically coupled to the substrate.

16. The package of claim 15, wherein the plurality of press-fit pins extend into a plurality of openings comprised through the cover.

17. The package of claim 15, wherein the cover comprises a potting opening therethrough.

18. The package of claim 15, wherein the case is configured to be fixedly coupled over one or more edges of the cover and over at least a portion of the substrate.

19. The package of claim 18, wherein the case comprises a plurality of locking projections that engage with the one or more edges of the cover and irreversibly lock the cover to the case.

\* \* \* \* \*